(12) United States Patent
Inoue (10) Patent No.: US 7,326,886 B2
(45) Date of Patent: Feb. 5, 2008

(54) WAFER SUPPORT MEMBER AND SEMICONDUCTOR MANUFACTURING SYSTEM USING THE SAME

(75) Inventor: Hironori Inoue, Kokubu (JP)

(73) Assignee: Kyocera Corporation, Kyoto (JP)

( * ) Notice: Subject to any disclaimer, the term of this patent is extended or adjusted under 35 U.S.C. 154(b) by 169 days.

(21) Appl. No.: 11/260,674

(22) Filed: Oct. 26, 2005

(65) Prior Publication Data

US 2006/0102595 A1    May 18, 2006

(30) Foreign Application Priority Data

Oct. 26, 2004    (JP)    ............... 2004-311243

(51) Int. Cl.
*H05B 3/68* (2006.01)
*H05B 3/08* (2006.01)
*H01R 12/04* (2006.01)

(52) U.S. Cl. .................. 219/444.1; 219/541; 174/262

(58) Field of Classification Search .. 219/443.1–468.2, 219/538, 548; 174/262, 255, 261, 267
See application file for complete search history.

(56) References Cited

U.S. PATENT DOCUMENTS 6,134,096 A * 10/2000 Yamada et al. ............. 361/234
6,242,719 B1 * 6/2001 Kano et al. ............... 219/444.1
6,255,601 B1 * 7/2001 Burkhart ..................... 174/262
6,444,957 B1 * 9/2002 Kitagawa et al. ......... 219/444.1
6,538,872 B1 * 3/2003 Wang et al. ................ 361/234

FOREIGN PATENT DOCUMENTS

JP    2003-133403    5/2003

* cited by examiner

*Primary Examiner*—Sang Paik
(74) *Attorney, Agent, or Firm*—Hogan & Hartson LLP (57) ABSTRACT

A simple and practical wafer support member which holds vacuum tight comprises a plate-shaped ceramic body having one main surface of a mount surface on which a wafer is mounted and a penetrating via hole from one main surface to the other main surface, a conductive layer provided on the mount surface, a connection conductive layer provided on an inner surface of the via hole so as to be connected to the conductive layer, a buried conductive layer which is buried in the plate-shaped ceramic body so as to be connected to the connection conductive layer, and a conducting terminal having one end and the other end and arranged apart from the via hole Of the plate-shaped ceramic body so that it is connected to the buried conductive layer in the vicinity of its one end and the other end protrudes from the other main surface of the ceramic body.

9 Claims, 7 Drawing Sheets

WAFER SUPPORT MEMBER AND SEMICONDUCTOR MANUFACTURING SYSTEM USING THE SAME

BACKGROUND OF THE INVENTION

1. Field of the Invention

The present invention relates to a wafer support member used to hold an object to be processed such as a semiconductor wafer in a film forming system such as PVD system, a CVD system, an ion plating system, a vapor deposition system, or an etching system (semiconductor wafer processing system), and a semiconductor equipment using the above wafer support member. More specifically, the present invention relates to a penetrated feeding structure in which an electrode provided on the vacuum side is connected to a terminal provided on the air side.

2. Description of the Related Art

In general, the semiconductor wafer processing system comprises a wafer support member, that is, a processing chamber on which a susceptor is mounted, and the wafer support member is used to support a wafer in the processing chamber. The wafer support member comprises various components to hold the wafer at a predetermined position on the wafer mount surface of the wafer support member to fix the wafer, and various components to heat and/or cool the wafer. In addition, the wafer is fixed by a mechanical fixing or an electrostatic chucking. Space above the wafer support member on which the wafer is processed in the processing chamber is kept in high vacuum in general and space below the wafer support member is kept at atmospheric pressure.

Figure 8A:
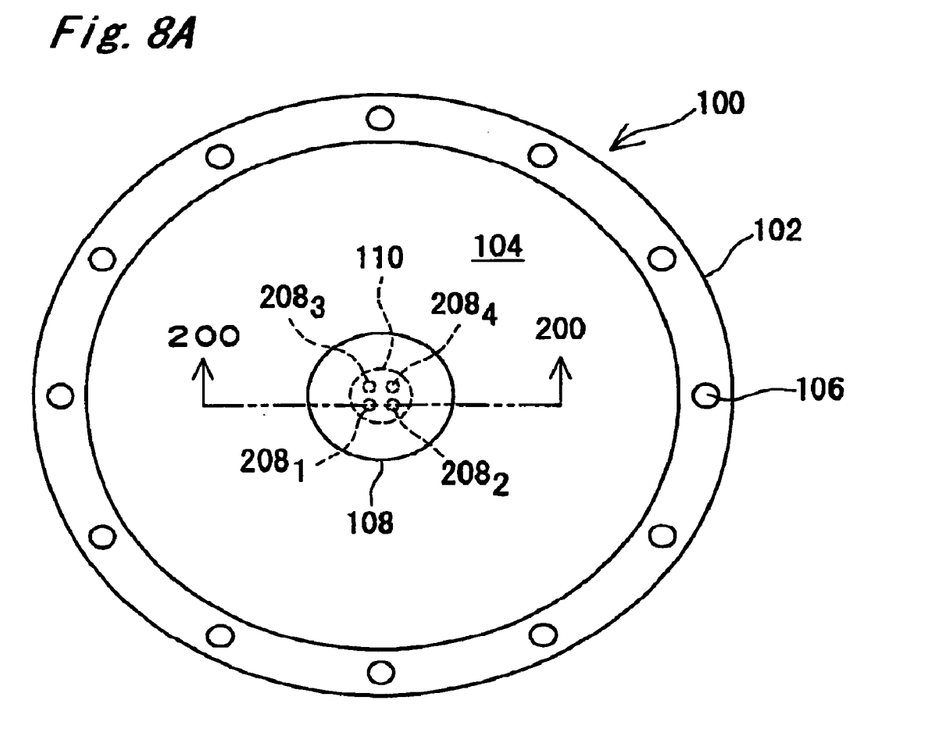
FIG. 8A is a plan view showing a conventional electrostatic chuck.
Figure 8B:
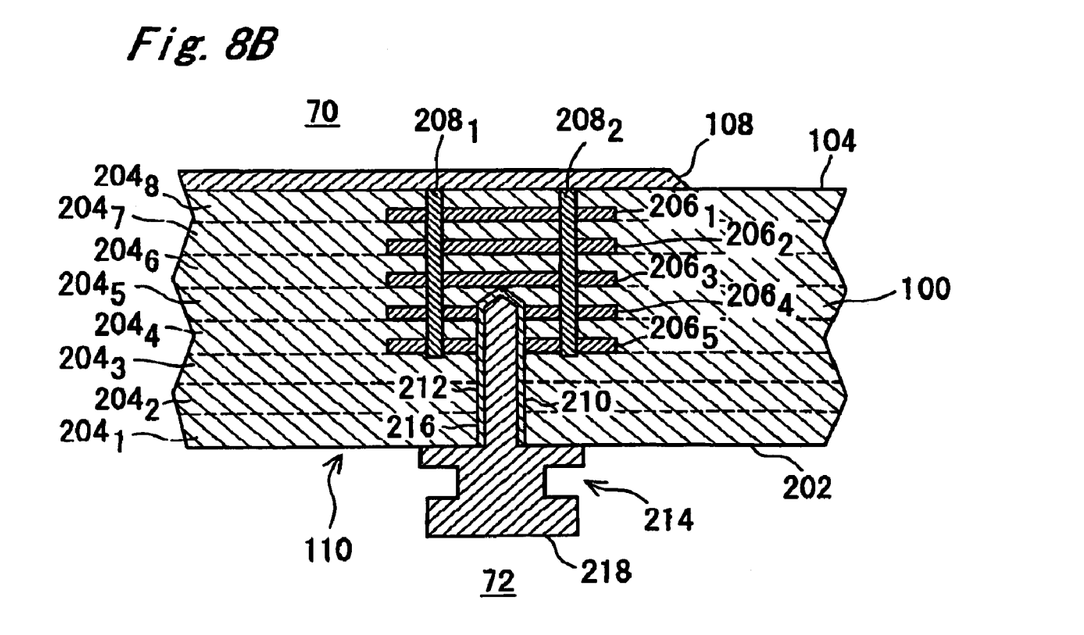
FIG. 8B is A partial sectional view of FIG. 8A.

A Japanese Unexamined Patent Publication No. 1998-326823 discloses a penetrated feeding structure 110 which connects an electrode provided on the vacuum side to an electrode on the air side in such wafer support member (FIGS. 8A and 8B). The wafer support member 100 comprises a periphery mounting flange 102 having a plurality of holes 106 and an electrode 108 in the center of a mount surface 104 as shown in FIG. 8.

FIG. 8B is a partially sectional view showing the wafer support member 100 taken along line 200-200 in FIG. 8A. The penetrated feeding structure body 110 in the wafer support member 100 has a structure as will be described below and it is used to supply a power from the air side 72 to the conductive electrode arranged on the vacuum side 70 and the electrode 108 fixed to the mount surface 104 of the wafer support member 100.

The penetrated feeding structure body 110 comprises a plurality of via holes 208 ($208_1$, $208_2$, $208_3$, and $208_4$, for example) arranged in the plate-shaped ceramic body vertically, a plurality of conductive layers 206 ($206_1$, $206_2$, $206_3$, $206_4$, and $206_5$, for example) connected to each other through the via holes 208, and a feeding terminal 214 connected to at least one of the conductive layers 206. The feeding terminal 214 is connected to the electrode 206 from the air side 72.

Figure 9A:
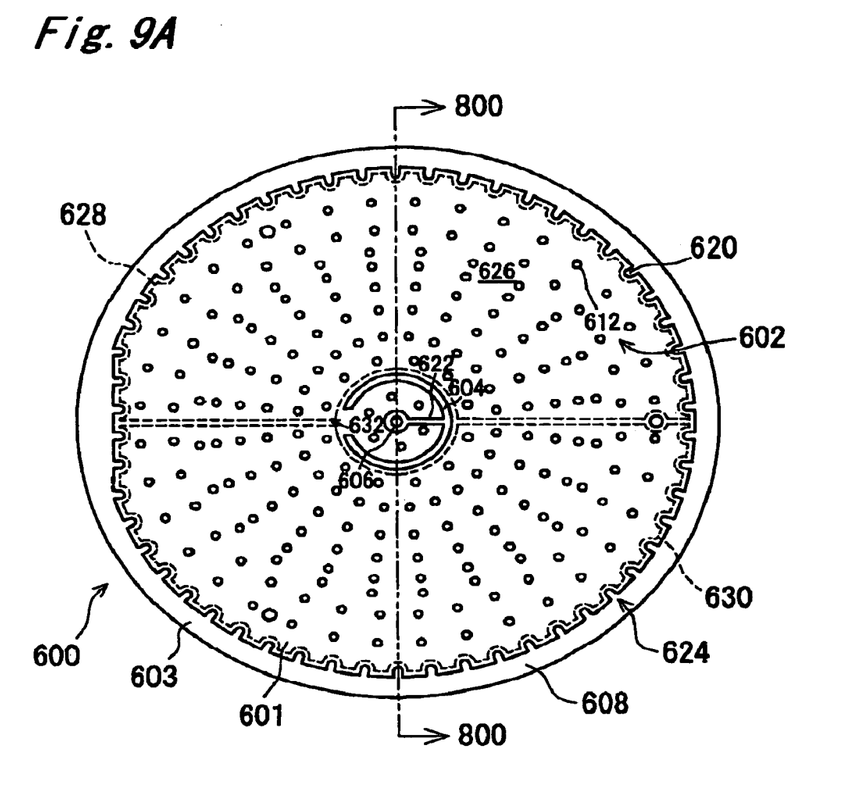
FIG. 9A is a plan view showing another conventional electrostatic chuck.
Figure 9B:
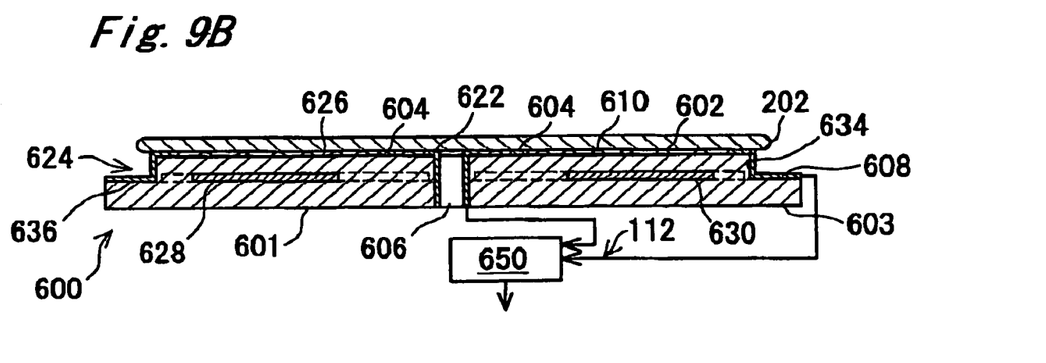
FIG. 9B is a sectional view of FIG. 9A.

In addition, a Japanese National Publication of International Application No. 2002-505036 discloses a wafer support member 600 having an electrostatic chuck mechanism as shown in FIG. 9A. FIG. 9B is a sectional view taken along line 800-800 in FIG. 9A. The wafer support member 600 comprises a gas supply via hole 606 through which a heat transmission medium (argon or helium gas, for example) is supplied to space between a wafer 202 and a chuck surface 626 of the wafer support member 600. In addition, the wafer support member comprises an electrode 604 on an inner surface and an electrode 624 on an outer surface in a wafer detection system. According to this wafer support member 600, the inner-surface electrode 604 is connected to a detection circuit 650 through a surface conductor 622 provided on an inner surface of the gas supply via hole 606. The surface conductor 622 is formed on an inner surface of the gas supply via hole 606 up to a rear surface of the wafer support member 600, and connects the inner-surface electrode 604 formed on the mount surface 626 of the wafer support member 600 to the detection circuit 660 provided below the wafer support member 600. For example, when the inner-surface electrode 601 and the outer-surface electrode 624 are used for detecting the wafer, an electrode of one end of the wafer detection circuit 650 is electrically connected to the inner-surface electrode 604.

However, according to the wafer support member described in the Japanese Unexamined Patent Publication No. 1998-326823, since the connecting structure body which connects the electrode fixed to the mount surface of the plate-shaped ceramic body to the electrode provided on the other surface of the plate-shaped ceramic body is manufactured by forming the via holes in each of the plurality of ceramic bodies which constitute the plate-shaped ceramic body and Connecting the respective via holes to the respective conductive layers, the structure of the connecting structure body is complicate and its manufacturing process becomes naturally complicated.

In addition, since it is necessary to provide an evacuating via hole separately from the connecting structure body, its structure becomes more complicated.

Furthermore, since the structure of the connecting structure body is complicated, the via hole formed in the ceramic body could not be sufficiently connected to the conductive layer. When these are preferably connected, a function to detect the existence of the wafer or a function to detect whether the wafer is damaged or not cannot be satisfactorily implemented.

Figure 10:
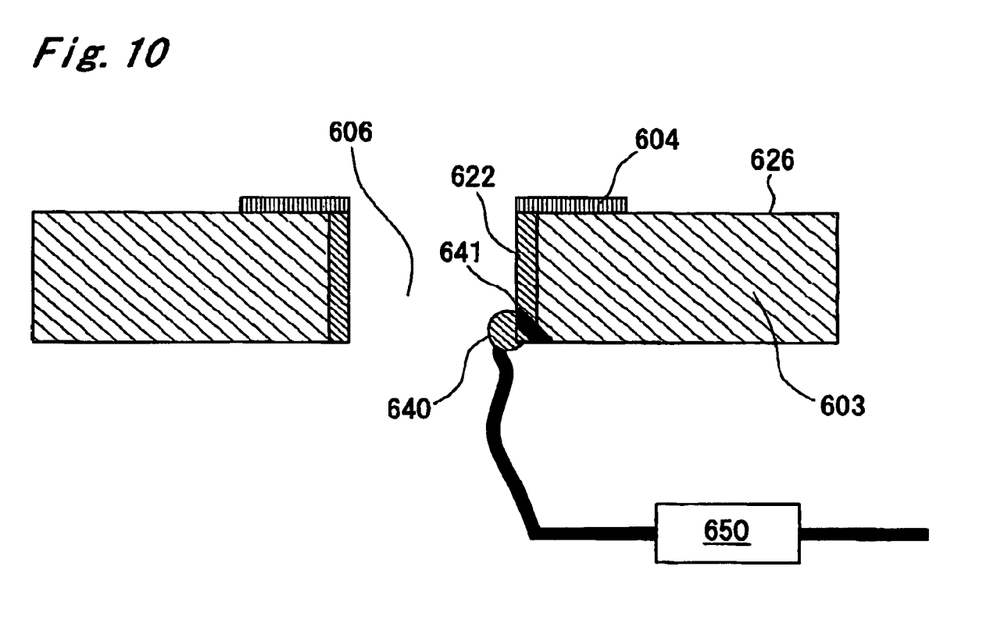
FIG. 10 is a partial sectional view showing an enlarge part of the electrostatic chuck shown in FIG. 9.

Still furthermore, according to the structure described in the Japanese National Publication of International Application No. 2002-505036, although a pipe is arranged on the rear surface of the wafer support member so as to be connected to the via hole for evacuation in general, a flange part of the pipe and a wiring which connects the electrode of one end of the wafer detection apparatus to a part of the surface conductor 622 cross to each other and a void is likely to be generated in the vicinity of the wiring at this crossed part. Therefore, the vacuum tightness could be broken in the pipe and on the mount surface of the wafer support member 600. In addition, the stress does not become uniform due to the thermal expansion difference between the brazed part and the wiring and distortion after the thermal cycles concentrates on this brazed part. Thus, after the heating and cooling operations were repeated, a crack 641 could be generated at the brazed part 640 between the wiring and the conduction layer on the inner surface of the gas supply hole as shown in FIG. 10. Thus, the conduction between the conductive layer and the wafer detection apparatus could not be implemented and vacuum tightness could be broken also at the junction part between the pipe and the via hole like the above.

SUMMARY OF THE INVENTION

Thus, it is an object of the present invention to provide a simple and practical wafer support member which holds vacuum tight, in which a conductive layer formed on a mount surface and a feeding terminal on an air side can be electrically connected with high reliability.

In order to attain the above object, a first wafer support member according to the present invention is characterized by comprising a plate-shaped ceramic body having one main surface of a mount surface on which a wafer is mounted and a penetrating via hole from one main surface to the other main surface, a conductive layer provided on the mount surface, a connection conductive layer provided on an inner surface of the via hole so as to be connected to the conductive layer, a buried conductive layer which is buried in the plate-shaped ceramic body so as to be connected to the connection conductive layer, and a conducting terminal having one end and the other end and arranged apart from the via hole of the plate-shaped ceramic body so that it is connected to the buried conductive layer in the vicinity of its one end and the other end protrudes from the other main surface of the ceramic body.

According to the first wafer support member in the present invention having the above constitution, since the buried conductive layer and the conducting terminal serves as a part of a wiring connected to the conductive layer, it is not necessary to provide the wiring at a junction part between a pipe and the via hole, for example, so that the wiring does not cross with the pipe connected to the via hole.

Therefore, a void is not formed at a flange part of the pipe, vacuum in the pipe and on the mount surface of an electrostatic chuck can be kept tight. In addition, since it is not necessary to braze a part between the wiring and the connection conductive layer formed on the surface of the via hole, conduction from the conductive layer to a detecting apparatus can be ensured without generating a crack at the brazed part.

In addition, according to the first wafer support member in the present invention, when it further comprises a conductive pipe connected to the via hole, the conducting terminal may be connected to the pipe and the pipe may serve as a part of the conducting terminal.

Thus, when the conductive pipe is used as a part of the conducting terminal, the structure of the wafer support member can be further simple. In addition, the brazed part of the conductive member connected to the buried conductive layer buried in the plate-shaped ceramic body and buried in the plate-shaped ceramic body so that its one end is exposed is covered with the flange part of the conductive pipe. Therefore, since the brazed part is not exposed to the air, an electric resistance value can be prevented from being varied due to oxidation of the brazing material and the like. As a result, the wafer support member can be stably used as a wafer detection device for a long time.

According to the wafer support member in the present invention, it is preferable that the diameter of the buried conductive layer is 5 mm to 100 mm. That is, when the diameter of the buried conductive layer is not less than 5 mm, processing damage is not generated during machine processing for the hole of the conducting terminal and the via hole in the center of the plate-shaped ceramic body, and the buried conductive layer is not likely to be affected by stress at the time of brazing. Meanwhile, when the diameter of the buried conductive layer is not more than 100 mm, it can be prevented that the buried conductive layer serves as a plasma electrode.

In addition, a second wafer support member according to the present invention is characterized by comprising a plate-shaped ceramic body having one main surface of a mount surface on which a wafer is mounted and a penetrating via hole from the one main surface to the other main surface, a conductive layer provided on the mount surface, a connection conductive layer provided on an inner surface of the via hole so as to be connected to the conductive layer, and a conductive pipe connected to be communicated with the via hole, in which the connection conductive layer and the conductive pipe are connected and the pipe serves as a conducting terminal.

According to the second wafer support member in the present invention having the above constitution, its structure is simple and can be easily manufactured.

According to the first and second wafer support members in the present invention, it is preferable that the connection conductive layer is mainly formed of silver and copper. When the connection conductive layer comprises silver and copper mainly, the wafer support member can hold heat resistance which is needed in the semiconductor manufacturing process.

According to the first and second wafer support members in the present invention, it is preferable that the conductive layer is provided so as to extend to the inner peripheral surface of the via hole and its extended part is connected to the connection conductive layer.

In this constitution, when the connection conductive layer comprises a brazing material, for example, since a brazing material layer comprising silver and copper is not provided at an upper part of the via hole, its brazing material element is not attached on the wafer, so that the wafer is prevented from being contaminated.

According to the first and second wafer support members in the present invention, the conductive layer may comprise a center conductive layer provided in the center of the mount surface, and a periphery conductive layer provided at a periphery of the mount surface so as to be electrically separated from the center conductive layer.

In this constitution, existence or a damage of the wafer can be known by mounting the wafer on the mount surface, applying a voltage to an electrostatic chucking electrode, for example, to chuck the wafer and measuring capacitance between the wafer and the conductive layer.

According to the wafer support member in the present invention, the conductive layer can be used to detect the wafer.

According to the first and second wafer support members in the present invention, the plate-shaped ceramic body may further comprise an electrostatic chucking electrode or a heater electrode.

In addition, the semiconductor equipment according to the present invention comprises the first or second wafer support member.

As described above, the present invention provides the wafer support member which can keep high vacuum tightness, and can electrically connect the conductive layer formed on the mount surface to the feeding terminal on the air side with high reliability.

Especially, the wafer support member according to the present invention can surely implement conduction, without extremely increasing conduction resistance of the feeding part or braking the feeding part even after the heating and cooling operations are repeated.

In addition, when the conducting structure in the present invention is used as the feeding part of a system for detecting existence or the damage of the wafer, the existence of the wafer on the mount surface or its damage can be detected with high precision Thus, the mount surface of the plate-shaped ceramic body is prevented from being etched or deposited by mistake, so that a trouble in the semiconductor manufacturing process can be effectively prevented.

DETAILED DESCRIPTION OF THE INVENTION

A wafer support member according to embodiments of the present invention will be described with reference to the drawings hereinafter. Although a wafer support member having a function to chuck a wafer to a mount surface by electrostatic force which is called an electrostatic chuck will be described in the following description, the present invention is not limited to the electrostatic chuck and it may be a wafer support member having another fixing structure.

EMBODIMENT 1

Figure 1:
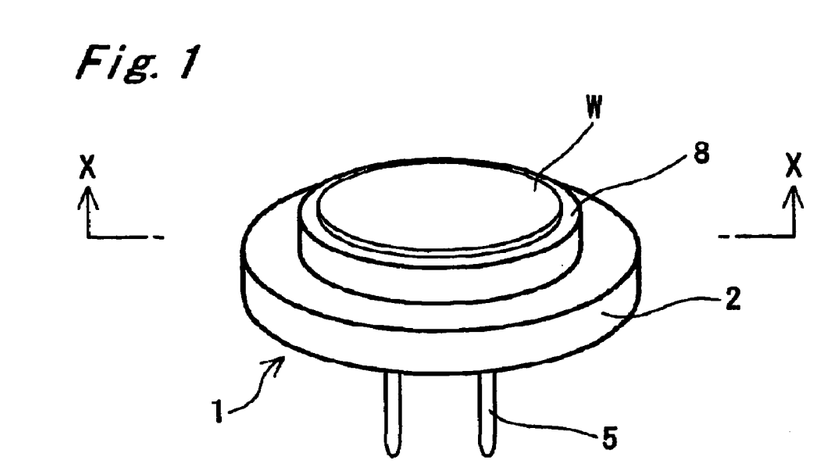
FIG. 1 is a perspective view showing a wafer support member according to an embodiment 1 of the present invention.
Figure 2:
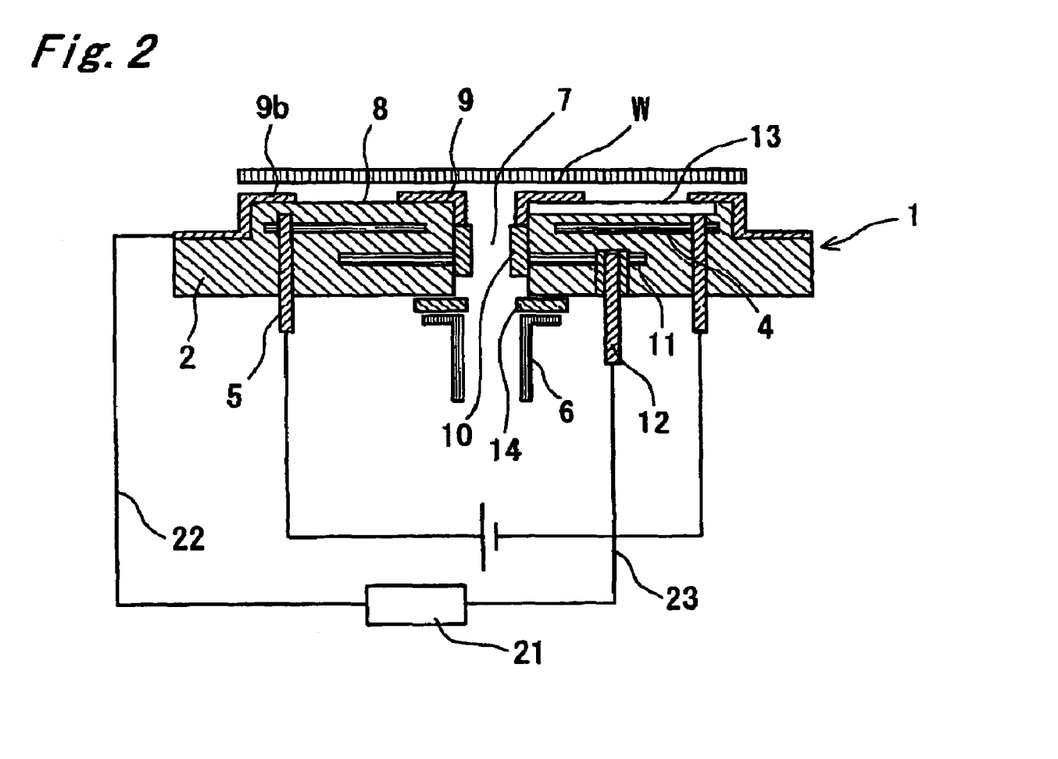
FIG. 2 is a sectional view taken along line X-X in FIG. 1.

FIG. 1 is a perspective view showing a constitution of a wafer support member according to an embodiment 1 of the present invention, and FIG. 2 is a sectional view taken along line X-X in FIG. 1.

The wafer support member 1 according to the embodiment 1 of the present invention compares a plate-shaped ceramic body 2 having almost the size as that of a wafer W. One main surface of the ceramic body 2 is a mount surface 8 on which the wafer is mounted. In addition, a pair of electrostatic chucking electrodes 4 is buried inside the plate-shaped ceramic body 2, and a feeding terminal 5 which sends electricity to the pair of electrostatic chucking electrodes 4 is buried so that its one end is exposed to the other main surface of the plate-shaped ceramic body 2. Furthermore, a conductive pipe 6 to flow gas on a rear surface of the wafer W is connected to the other main surface of the plate-shaped ceramic body 2 through a junction layer 14. This pipe 6 is connected to a via hole 7 which penetrates the plate-shaped ceramic body 2 and used to draw a vacuum or supply gas. In addition, this conductive pipe 6 is preferably a metal pipe.

According to the wafer support member 1 thus constituted in the embodiment 1, the wafer W is mounted on the mount surface 8 and electrostatic chucking force is generated when a DC voltage is applied to the pair of electrostatic chucking electrodes, so that the wafer W can be fixed onto the mount surface 8.

For example, a detection circuit (electric impedance meter) 21 to detect a defect in the wafer and the like is provided in the wafer support member 1 in the embodiment 1. More specifically, a conductive layer 9 is provided on the mount surface 8 of the plate-shaped ceramic body 2 and the conductive layer 9 is connected to a conducting terminal 12 provided on the other main surface of the plate-shaped ceramic body 2 through a connection conductive layer 10 formed on a surface different from the mount surface 8 and a buried conductive layer 11 buried in the plate-shaped ceramic body 2.

Further specifically, the thin conductive layer 9 having a thickness of a few µm is provided on a surface of the mount surface 8 so as to be extended to an inner peripheral surface of the via hole 7, the connection conductive layer 10 is provided on the inner peripheral surface of the via hole 7 so as to be connected to the conductive layer 9, and the buried conductive layer 11 is buried in the plate-shaped ceramic body 2 so as to be connected to the connection conductive layer 10 on the inner peripheral surface of the via hole 7. Thus, the buried conductive layer 11 is connected to the conducting terminal 12 provided on the other main surface of the plate-shaped ceramic body 2. In this structure, the electricity can surely flow from the conducting terminal 12 to the conductive layer 9, and the buried conductive layer 11 and the conducting terminal 12 can be connected at a place apart from the via hole 7.

Here, the conductive layer 9 can be formed of metal such as tungsten, titanium and the like by chemical vapor deposition and the like.

In addition, since the conductive layer 9 detects a partial defect and the like of the wafer together with an outer conductive layer 9b, an outer diameter of the central conductive layer 9 is preferably as small as possible. However, when it is too small, conduction with the wafer W could be difficult. Therefore, it is preferable that a maximum diameter of the central conductive layer 9 is preferably about 5 to 50 mm so that the device can surely detect the wafer W on the mount surface 8. Further preferably, it is 10 to 30 mm. In addition, in order to prevent a film from peeling off by stress generated when the film is formed, a thickness of the conductive layer 9 is preferably thin as much as possible, but in order to eliminate a conduction defect due to abrasion while the wafer is repeatedly absorbed, the thickness of the conductive layer 9 is preferably 0.2 µm to 10 µm, and more preferably 0.5 µm to 5 µm.

In addition, the connection conductive layer 10 is manufactured such that metal such as gold, copper, titanium and the like is applied to the inner surface of the via hole 7 and heated in vacuum to metalize the ceramic surface and a brazing material such as an alloy of silver and copper or an alloy of gold and nickel is applied to the metalized surface. In addition, the buried conductive layer 11 is mainly formed of tungsten or molibdenum. The conducting terminal 12 is preferably formed of an alloy of Fe—Ni—Co when the plate-shaped ceramic body 2 is formed of a low thermal expansion material such as nitride or a carbide.

In order to energize the conductive layer 9 through the conducting terminal 12, it is preferable that the connection conductive layer 10 is formed on the inner surface of the via hole 7 which penetrates the plate-shaped ceramic body 2. When the connection conductive layer 10 is provided on the inner surface of the via hole 7 to conduct, a contact defect between a via hole and a conductive layer (such defect being described in the Japanese Unexamined Patent Publication No. 1998-326823) can be prevented. In addition, when the buried conductive layer 11 is exposed to the inner side of the via hole 7 and this exposed part and the connection conductive layer 10 are brazed with the brazing material layer, the conduction is surely implemented.

EMBODIMENT 2

Figure 3:
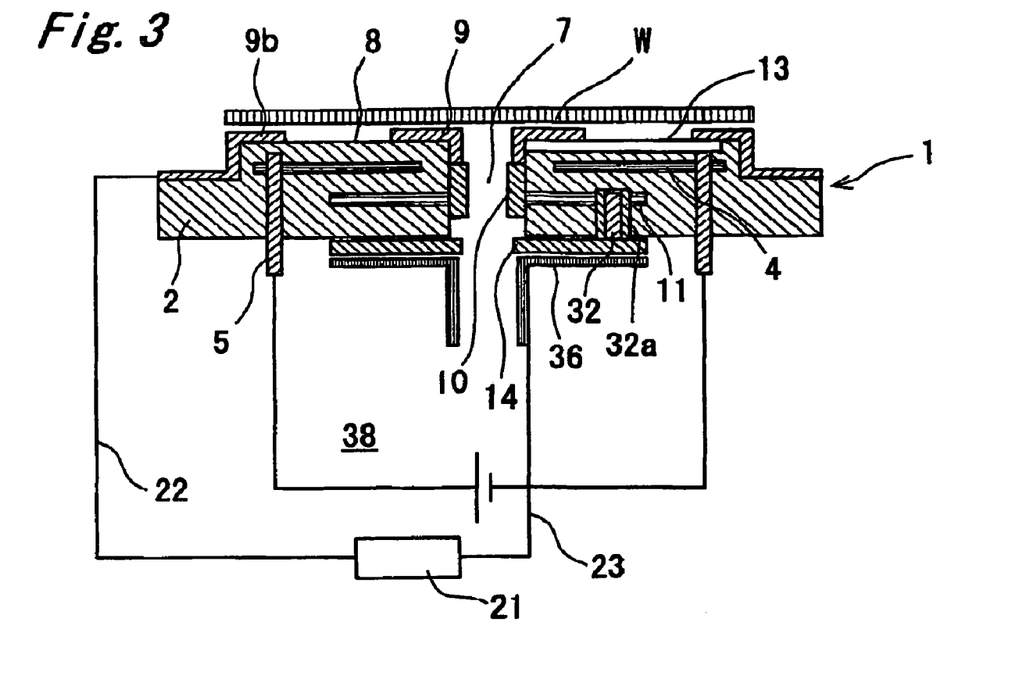
FIG. 3 is a sectional view showing a wafer support member according to an embodiment 2 of the present invention.

FIG. 3 is a sectional view showing an example of a wafer support member according to an embodiment 2 of the present invention. According to the electrostatic chuck shown in the embodiment 1, one electrode of the electric impedance meter 21 is connected to the conducting terminal 12 through a lead wire 23. Meanwhile, according to the electrostatic chuck shown in the embodiment 2, one of the electric impedance meter 21 is connected to a conductive pipe 36 through a lead wire 23. In this respect, the embodiment 2 is different from the embodiment 1. Other than the above, the constitution of the electrostatic chuck of the embodiment 2 is the same as that of the embodiment 1. Thus, according to the electrostatic chuck in the embodiment 2, a brazed part 32a is prevented from being oxidized and it is superior to the electrostatic chuck in the embodiment 1 in this respect. The electrostatic chuck of the embodiment 2 will be described in detail hereinafter.

As described above, according to the wafer support member (electrostatic chuck) 1 in the embodiment 2, the conductive pipe 36 is used as the conducting terminal and a central axis of the via hole 7 coincides with a central axis of the conductive pipe 36 and the conductive pipe 36 is connected to the via hole 7 so that the via hole 7 communicates with the conductive pipe 36. According to the wafer support member 1 in this embodiment 2, as shown in FIG. 3, a conduction member 32 connected to the buried conductive layer 11 is connected to the conductive pipe 36 having a flange connected to the via hole 7 to conduct. In this structure, since the brazed part 32a provided on the periphery of the conduction member 32 is not exposed to atmospheric air 38, an electric resistance value is not varied by oxidation of the brazing material and the like, so that it can be stably used for a long period of time. Although the mount surface 8 of the wafer support member 1 is positioned in a process chamber in a normal semiconductor equipment, a rear surface on which the pipe 36 or conducting terminal 12 and the like are brazed is exposed to the air in many cases. Therefore, it is highly likely that the brazed part 32a is oxidized when it is used under a high-temperature condition. However, in the above constitution, since the brazed part 32a of the conduction member 32 is protected by the flange part of the pipe 36, its oxidation can be prevented.

The buried conductive layer 11 is preferably a circular conductive layer which is almost parallel to the mount surface 8.

That is, since the buried conductive layer 11 is formed of high melting point metal such as W, a stress due to thermal expansion difference from the plate-shaped ceramic body 2 is generated, so that it is preferable that the stress is made uniform centrosymmetrically in the plate-shaped ceramic body 2.

In addition, an outer diameter (diameter) of the circular buried conductive layer 11 is preferably 5 mm to 100 mm. The reason why will be described hereinafter.

A diameter of the central via hole 7 is preferably 1 mm or more in view of workability of the plate-shaped ceramic body 2 and stably supplying a small amount of gas. In addition, as shown in FIG. 2, the conducting terminal 12 is brazed at a place adjacent to the via hole 7 provided in the center of the plate-shaped ceramic body 2. Here, a diameter of the conducting terminal 12 has to be 1 mm or more in order to provide preferable electric conduction between the conducting terminal 12 and the hole to which the conducting terminal 12 is inserted in view of manufacturing point. In addition, it is necessary to provide a distance of a few millimeters between the hole to which the conducting terminal 12 is inserted and the via hole 7 provided so as to penetrate the center of the plate-shaped ceramic body 2 in order to prevent process damage when they are mechanically processed and avoid an influence of the stress at the time of brazing. Thus, in the constitution in which the central via hole 7 and the brazed part 32a formed in the hole to which the conducting terminal 12 is inserted are made conductive, it is preferable that a size of the buried conductive layer 11 is provided such that the distance from the center of the via hole 7 is 2.5 mm or more, that is, a diameter of the buried conductive layer 11 is 5 mm or more.

Meanwhile, the semiconductor equipment is used in a plasma atmosphere in many cases. In this case, the electrostatic chucking electrode is used as a plasma generating electrode also and a metal base (not shown) provided on a surface opposite to the mount surface of the plate-shaped ceramic body 2 is used as a plasma generating electrode in many cases. In this case, when the diameter of the buried conductive layer 11 is increased, the buried conductive layer 11 could serve as the plasma generating electrode, which is not preferable. In this respect, the diameter of the buried conductive layer 11 is preferable 100 mm or less which is smaller than the diameter 200 mm of the silicon wafer.

In addition, when a buried position of the buried conductive layer 11 is close to the mount surface 9, it could serve as the plasma electrode also, which is not preferable. Thus, it is preferable that it is buried apart from the mount surface 8 as much as possible. Meanwhile, when the buried conductive layer 11 is dose to the surface opposite to the mount surface 8, since the feeding terminal 5, the conducting terminal 12 and gas pipes 6 and 36 are brazed, the stress due to the brazing could impinge on up to a depth of a few millimeters and a clack could be generated in the buried conductive layer. Thus, it is preferable that the buried conductive layer 11 is buried in a position also apart from the surface opposite to the mount surfaces 8 and 48. As a result, it is preferable that the buried position of the buried conductive layer 11 is apart from the mount surface 8 by 1 mm or more and apart from the surface opposite to the mount surface 8 by 2 mm or more. More preferably, the buried position of the buried conductive layer 11 is apart from the mount surface 8 by 5 mm or more and apart from the other main surface of the plate-shaped ceramic body 2 by 5 mm or more.

EMBODIMENT 3

Figure 4:
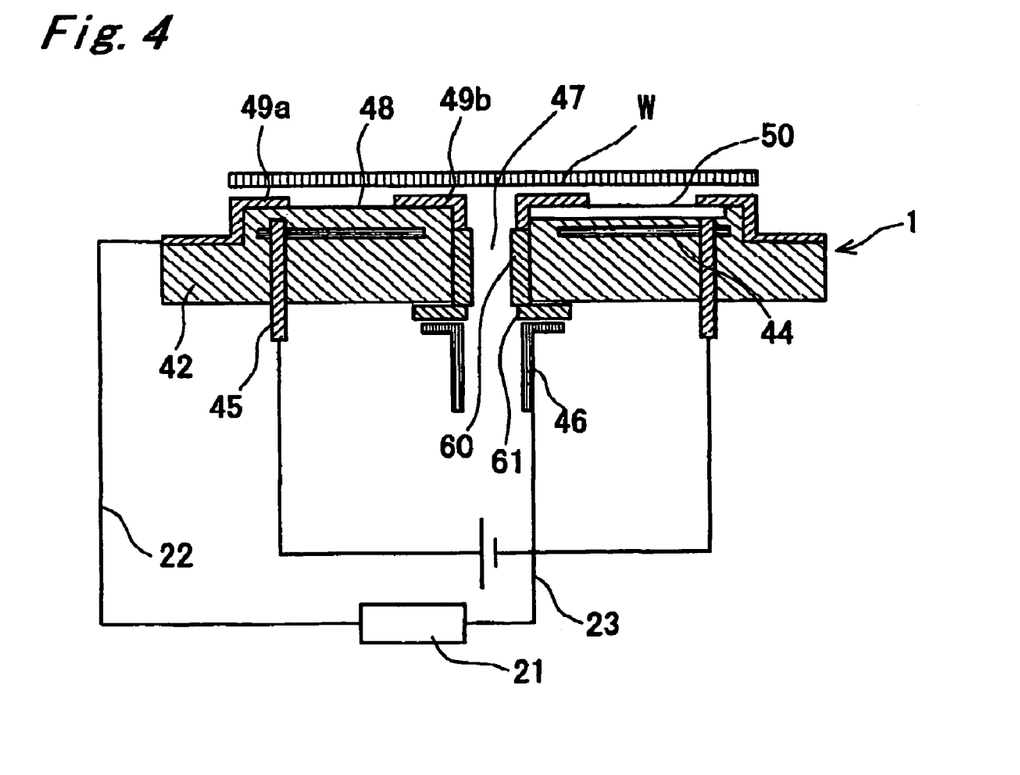
FIG. 4 is a sectional view showing a wafer support member according to an embodiment 3 of the present invention.

FIG. 4 is a sectional view showing an example of a wafer support member 1 according to an embodiment 3 of the present invention According to the electrostatic chuck in the embodiment 2, as shown in FIG. 3, the conductive pipe 36 connected to one electrode of the electric impedance meter 21 through the lead wire 23 is connected to the connection conductive layer 10 through the conduction member 32 and the buried conductive layer 11. Meanwhile, according to an electrostatic chuck in the embodiment 3, as shown in FIG. 4, a conductive pipe 46 is directly connected to a connection conductive layer 60, which is different from the electrostatic chuck in the embodiment 2. Other constitution is the same as that of the electrostatic chuck in the embodiment 2. Thus, since it is not necessary to manufacture the conduction member 32 and the buried conductive layer 11 in the electrostatic chuck according to the embodiment 3, a structure of the electrostatic chuck is simple and it is easily manufactured. As a result, the electrostatic chuck in the embodiment 3 is superior to the electrostatic chuck in the embodiment 2 in the above respect. The electrostatic chuck according to the embodiment 3 will be described in detail hereinafter.

According to the wafer support member 1 according to the embodiment 3 of the present invention, one main surface of a plate-shaped ceramic body 42 is a mount surface 48 on which a wafer is mounted and a via hole 47 penetrating a plate-shaped ceramic body 42 and a metal pipe 46 connected to the via hole 47 are provided. In addition, a conductive layer 49b is provided on the mount surface 48 and the conductive layer 49b is connected to the metal pipe 46 provided on the other main surface of the plate-shaped ceramic body 42 through the connection conductive layer 60 provided on an inner surface of the via hole 47. That is, according to the embodiment 3, the metal pipe 46 is used as a conducting terminal 46 According to a feeding structure in which the conductive layer 49b and the connection conductive layer 60 are directly connected and the connection conductive layer 60 and the pipe 46 arc directly connected, its structure is simple and easily manufactured.

Figure 5:
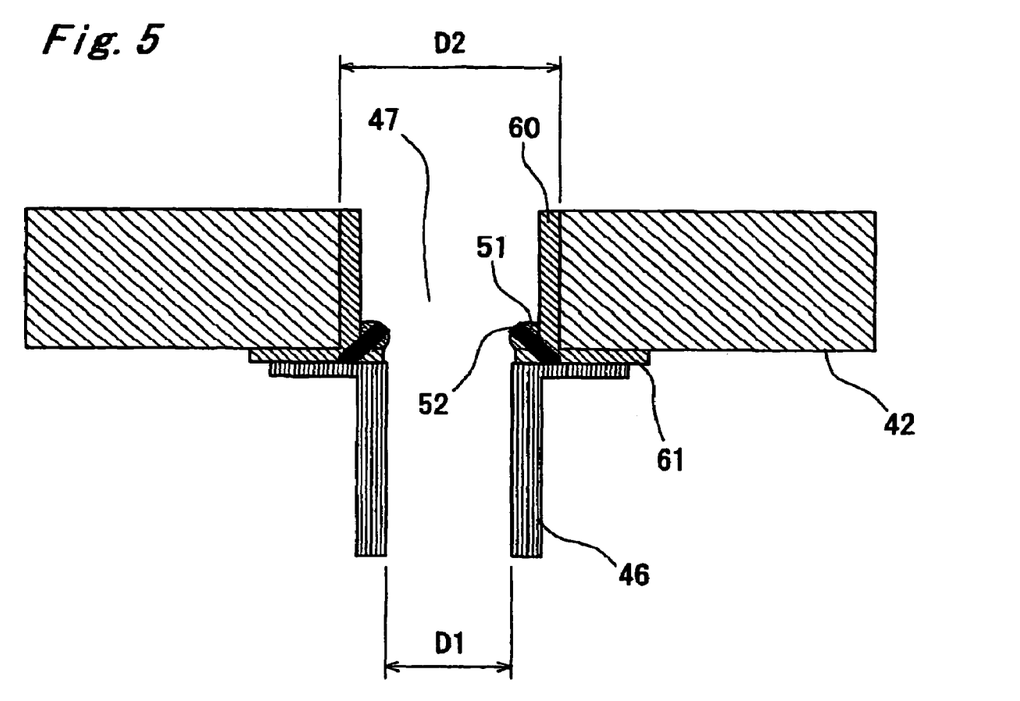
FIG. 5 is an enlarged sectional view of a part shown in FIG. 4.

According to a wafer support member 1 shown in FIG. 4, when a brazing material is applied to a metalized layer as the connection conductive layer 60, the brazing material pools at an end part of the via hole 47 or an end surface of the pipe 46, that is, a brazing material pool is easily generated, 80 that a crack is likely to occur in a brazing material pool 51 shown in FIG. 5. However, the crack can be prevented by appropriately adjusting an amount of the brazing material or grinding and removing the brazing material pool 51 when it is generated. As a result, conduction between the connection conductive layer 60 and the pipe 46 can be surely provided.

A preferable embodiment of each member in the embodiments 1 to 3 and another embodiment will be described hereinafter.

First, it is preferable that the connection conductive layers 10 and 60 are mainly formed of silver and copper. That is, according to the brazing material mainly formed of silver and copper, a brazing temperature is about 800° C. or lower and although its heat resistance is not high, it is higher than 600° C. at which the wafer support member 1 is used in a semiconductor manufacturing process, so that heat resistance as the wafer support member 1 used at that temperature can be satisfied. In addition, since the brazing material is soft, it can alleviate thermal stress generated due to thermal expansion difference between the plate-shaped ceramic body 2, 42 and the connection conductive layers 10 and 60. In addition, although there is a case the wafer support member 1 is used at a high temperature in a vacuum atmosphere, it is not likely that a brazing material element becomes gas and attaches on the wafer to cause pollution unlike a brazing material containing Pb and the like. Furthermore, since the brazing material mainly formed of silver and copper has small electric resistance, it shows preferable electric characteristics as the conduction material.

Although the conductive layers 9 and 49b are mounted on the 8 and 48 in the above embodiments, respectively, a component having the same conductivity as that of the conductive layers 9 and 49b may be formed on the part of the inner surfaces of the via holes 7 and 47, respectively and the conductive layers 9 and 49b and the conductive material may be connected. In this case, since the brazing material layer formed of silver and copper and the like is not formed at an upper part of the via hole 7, the brazing material element is not attached to the wafer and the wafer is prevented from being contaminated.

In addition, as the electrode structure on the mount surface, it is preferable that the conductive layers 9 and 49b which come into contact with the wafer W are provided in the center of the mount surfaces 8 and 48 and the periphery conductive layers 9b and 49a are provided at peripheries of the mount surfaces 8 and 48, respectively. When the periphery conductive layers 9b and 49a are provided, an existence or a damaged condition of the wafer can be known by measuring capacitance C between the conductive layers 9 and 49a and the conductive layers 9b and 49b after the wafer W is mounted on the mount surfaces 8 and 48 and a voltage is applied to the electrostatic chucking electrodes 4 and 44 to chuck the wafer W, respectively.

In addition, although the case where the electrostatic chucking electrodes 4 and 44 are buried in the wafer support member 1 in the present invention has been described, it is needless to say that when a wafer support member is provided in which a heater electrode is buried in the plate-shaped ceramic body 2 so that a temperature of the wafer W is controlled, a more reliable feeding structure can be implemented.

Next, other constitutions of the feeding structure according to the present invention will be described.

When the buried conductive layer 11 is formed of a low thermal expansion material such as W or Mo, the stress due to a thermal expansion difference from a low thermal expansion material such as aluminum nitride ceramics and the like can be reduced. In addition, when a thickness of the buried conductive layer 11 is a few μms, the generated stress can be very small.

Next, a connection structure of the conducting terminal 12 will be described. It is preferable that the conducting terminals 12, 36 and 46 have thermal expansion coefficient of about $5\times10^{-6}/°$ C. which is similar to that of the plate-shaped ceramic bodies 2 and 42 comprising aluminum nitride or silicon carbide as nitride or carbide, and they are formed of a metal material having a low thermal expansion coefficient such as KOVAR (trademark of Fe—Ni—Co alloy), W, Mo which is not hardly broken like the brazing material. In addition, apart of the metal material which is buried in the plate-shaped ceramic bodies 2 and 42 preferably has a structure in which a counterbore (not shown) is provided to alleviate the thermal stress. In this respect, the metal pipes 36 and 46 arc preferably used. In addition, the diameter of the buried part of the conducting terminal 12 in the plate-shaped ceramic body 2 is preferably 0.5 to 4 mm and more preferably 1 to 3 mm in view of alleviating the thermal stress. In addition, a screw (not shown) is preferably provided at an end of the conducting terminal 12 to be connected to an external terminal. In addition, when the feeding terminal is the metal pipes 36 and 46, a screw (not shown) can be provided at their ends or may be welded to the ends to be connected to an external terminal.

In addition, after metalized layer is formed of metal such as silver, copper, titanium and the like, the size of the brazed hole and the outer diameter of the terminal at the brazed part of the conducting terminal 12 are designed so that a distance between the hole to be filled with the brazing material and the terminal can be small and the member is manufactured to a predetermined dimension by machine processing. As a result, the stress due to the brazing is not increased beyond a designed value, so that stress at the brazed part can be reduced. It is preferable that the size of the hole to be brazed is 0.5 mm or more so that electrical conduction can be surely implemented by the conducting terminal 12 and it is 10 mm or less so that the stress due to the brazing can be small. More preferably, it is 1 to 5 mm. In addition, a distance between the conducting terminal 12 and the hole is preferably 0.05 to 0.5 mm of clearance so that the stress due to the brazing is small and their gap can be filled with the brazing material.

Although the conducting terminal 12 is brazed in the above description, the brazing may be performed so that the conduction member 32 is connected to the pipe 36 as shown in FIG. 3. This structure shown in FIG. 3 is the same as that of the brazed conducting terminal 12, and a depth of the hole and a length of the conduction member is designed so that the conduction member 32 is connected to the pipe 36 and a gap is generated

WORKING EXAMPLE 1

Examples of the present invention will be described below.

According to an example 1, a wafer support member having a electrostatic chuck mechanism was made. That is, only an organic binder and a solvent were added to a AlN raw material powder having a purity of 99% and an average diameter of 1.2 μm to be like slurry and a plurality of green sheets having a thickness about 0.5 mm were manufactured from the above by a doctor blade method. An electrode paste for electrostatic chucking electrodes 4 and 44, a heater electrode, and a buried conductive layer 11 was made by mixing 5% by weight of AlN raw material powder and an organic binder to raw material powder of W having a purity of 99% or more and an average diameter of about 2 μm. Then, this conductive material paste was printed on the green sheet by screen printing method and the predetermined electrode was formed. The buried conductive layer 11 having a diameter of 50 mm was laminated and arranged so that its position was in the vicinity of the center of the plate-shaped ceramic body in a thickness direction. Various kinds of green sheet laminated body in which the electrostatic chucking electrodes 4 and 44 and the heater electrode and the buried electrode were provided according to need were thermally pressed at 50° C. at 5000 Pa and the laminated body in which adhesiveness between the green sheets is enhanced was formed into a disk shape by a cutting process and this disk-shaped laminated body was performed a debinder process in vacuum. Then, the disk-shaped laminated body was sintered at a high temperature of 2000° C. under a nitrogen atmosphere. Thus, various kinds of plate-shaped ceramic bodies comprising the electrostatic chucking electrode, the heater electrode and the buried conductive layer 11 formed of W were manufactured.

Then, the plate-shaped ceramic bodies were ground so that its diameter might become 200 mm and its thickness might become 9 mm and a distance from the mount surface to the electrostatic chucking electrode might become 0.5 mm. Then, a surface of the ground plate-shaped ceramic body was finished so that its arithmetic average surface roughness Ra might become 0.2 μm to be the mount surface. In addition, a via hole having a diameter of 5 mm through which gas flows on a rear surface of the wafer was provided in the vicinity of the center of the plate-shaped ceramic body. In addition, holes to be connected to the electrostatic chucking electrode, the heater electrode and the buried conductive layer were provided on a surface opposite to the mount surface according to need.

Then, in order to metalize a predetermined part of the plate-shaped ceramic body, three kinds of raw material powder bodies such as Ag, Cu and Ti were measured so as to be 75, 22 and 3% by weight, respectively. Then, the raw material powder were mixed with 10% by weight of an organic binder and a paste for metallization was manufactured. As the metal raw material powder, when the fine powder having an average diameter of 2 μm or less is used, the metal raw material power can be easily diffused in the ceramics and the metalized layer can be uniformly formed. The metallization paste was applied to the inner surface of the via hole to flow gas formed in the center of the plate-shaped ceramic body, and the predetermined parts to which the feeding terminal for the electrostatic chucking electrode, the feeding terminal for the heater electrode, and the conducting terminal for the buried conductive layer and the conduction member were brazed so that a uniform film having a thickness of about 0.2 mm was formed at each part. Then, the plate-shaped ceramic body to which the metallization paste was applied was heated at about 1000° C. in a vacuum furnace for 15 minutes and the metalized layer was formed on the ceramic surface. Then, using a sheet-shaped brazing material mainly comprising 82.5% by weight of Au and 17.5% by weight of Ni and having a thickness of about 0.1 mm and a sheet-shaped brazing material mainly comprising 72% by weight of Ag and 28% by weight of Cu and having a thickness of about 0.1 mm as brazing materials, the feeding terminal for the electrostatic chucking electrode, the feeding terminal for the heater electrode, the conducting terminal for the buried conductive layer and the conduction member which were formed of KOVAR (trademark of Fe—Ni—Co alloy) were brazed at about 1000° C. or 850° C. in vacuum. Thus, samples No. 1 to 6 were manufactured.

As shown in FIG. 2, a gas pipe having an inner diameter of 5 mm and outer diameter of 6 mm and formed of KOVAR (trademark of Fe—Ni—Co alloy) was brazed so that the diameter of the via hole provided in the center to flow gas might coincide with inner diameter of the gas pipe for the samples 1 and 4. According to the sample No. 1, the brazing material mainly formed of Au and Ni was used and according to the sample No. 4, the brazing material mainly formed of Ag and Cu was used For the sample No. 2, as shown in FIG. 3, a conductive pipe 36 in which an outer diameter of a flange part was 50 mm was brazed through a junction face 14 having an outer diameter of 50 mm so that a conduction member 32 connected to a buried conductive layer 11 might not be exposed to the surface.

For the sample No. 3, as shown in FIG. 4, a connection conductive layer 60 comprising a brazing material layer was formed on the inner surface of the via hole and it is connected to a conductive layer 49b and a pipe 46. According to the sample No. 3, after the pipe 46 is brazed, the brazing material pool at the connection part of the pipe 46 was removed by machine process.

The wafer support member according to the sample No. 5 as a comparative example has a conventional feeding structure shown in FIG. 8. Therefore, a conductive layer 108 on a mount surface 104 was connected to the conducting terminal formed of KOVAR (trademark of Re—Ni—Co alloy) through five electrode layers and via holes. Here, in such feeding structure, five conductive layers 206 each having an outer diameter of 10 mm and a thickness of 10 μm were provided. Then, eight via holes each having an outer diameter of 0.5 mm were arranged on each layer and the conductive layers 206 are conducted to each other. In addition, according this via hole, the above conductive material paste using W powder was printed and applied to its inner surface.

In addition, the sample No. 6 having a feeding structure shown in FIG. 9 was manufactured as a comparative example. According to this sample, an inner surface electrode 604 formed on a mount surface 626 and an inner surface of a gas supply hole 606 serve as surface conductors and a metalized layer comprising silver, copper and titanium and a connection conductive layer comprising gold and nickel brazing materials were formed like the sample No. 1. A copper wire having an outer diameter of 1 mm was brazed with the brazing material to the connection conductive layer as shown in FIG. 10.

In addition, although it is not shown in the drawing, a heater electrode was buried in all of the sample wafer support members so that the wafer support member could be heated. According to the samples No. 1 to 3 and 5 and 6, a gold and nickel brazing was used as the brazing material.

Then, finally, a conductive layer comprising TiN was formed on all of the manufactured samples. The MN conductive layer was formed on the surface of the mount surface and the inner surface of the via hole using a PVD equipment. In addition, this film was patterned into a predetermined configuration having a thickness of 3 µm or less using a TiN target material.

Figure 6:
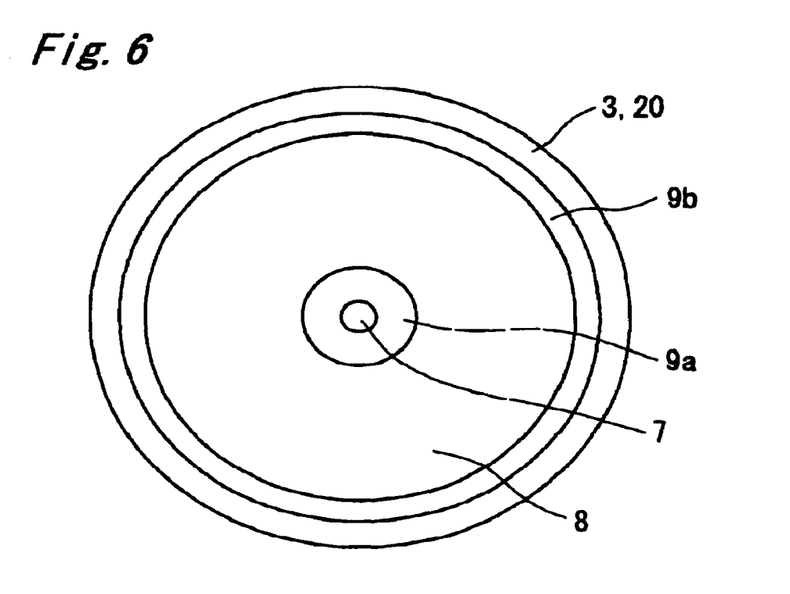
FIG. 6 is a plan view showing a conductive layer pattern on a mount surface in the wafer support member of the present invention.
Figure 7:
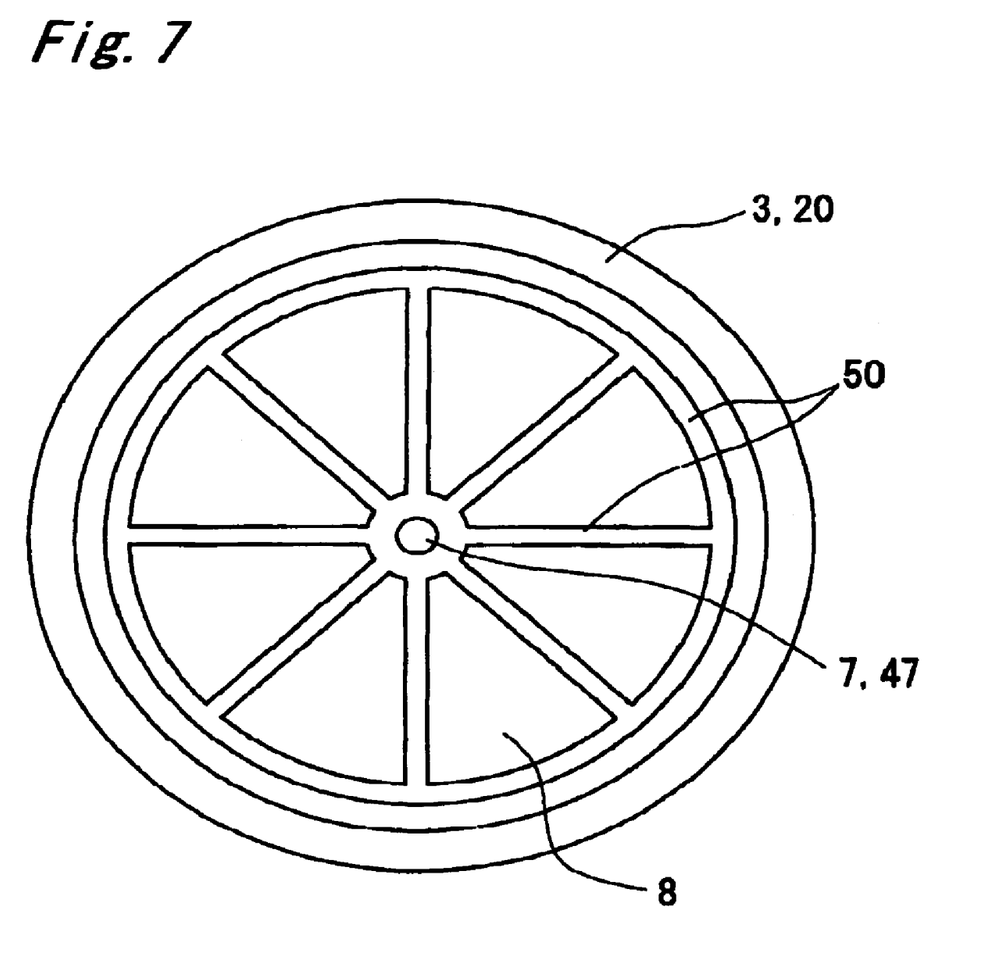
FIG. 7 is a view showing a configuration of a gas groove on the mount surface in the wafer support member of the present invention.

As shown in FIG. 6, the pattern configuration of the conductive layer has two inner and outer rings. The inner ring has an inner diameter 5 mm and an outer diameter 20 mm, and the outer ring has an inner diameter 180 mm and an outer diameter 200 mm. In addition, according to the outer ring, a conductive layer was formed on a side surface of the peripheral part and its stepped part so as to become conductive. In addition, it was confirmed that the chucked wafer would not be deformed nor cause the reduction of the chucking force because of the thickness of the conductive layer.

Thus, the manufactured electrostatic chuck was arranged in the PVD equipment and the wafer W was mounted on the mount surface of the electrostatic chuck and the heater electrode was turned on to heat the wafer W. Thus, reliability of the feeding structure of the electrostatic chuck was evaluated. According to a method of evaluating the reliability, the conductive layers were conducted by the wafer W and electric resistance through the feeding structure was measured and checked how it was changed after repeated heating and cooling processes Here, the heating temperature was adjusted to a predetermined temperature by measuring a wafer temperature by a thermocouple fixed to the rear surface of the sample.

The heating temperature was set to 200° C., 300° C. and 500° C. which were film forming temperatures and heating operation was performed from room temperature 25° C. to each temperature at 20° C./min and each temperature was kept for 10 minutes. Then, a heater power supply was turned off and the temperature was cooled down as it is. Then, the electric resistance value at the time of wafer chucking at a room temperature was measured. In addition, the applied voltage to the electrostatic chucking electrode for chucking the wafer was set to +/−250V. Then, a value provided by subtracting an electric resistance value before the heating and cooling test from an electric resistance value of the wafer after the test is divided by electric resistance value before the test and multiplied by 100 to calculate a rate of the electric resistance change.

Thus, a film forming temperature, the number of heating and cooling operations and a rate of electric resistance change are shown in a Table 1.

TABLE 1

| | | Rate of electric resistance change Film-forming temperature | | | | | |
|---|---|---|---|---|---|---|---|
| Sample | Brazing material | 200 | 200 | 300 | 300 | 500 | 500 |
| | | The number of heating and cooling | | | | | |
| No. | element | 50 | 100 | 50 | 100 | 50 | 100 |
| 1. | Au—Ni | 2% | 2% | 2% | 2% | 3% | 5% |
| 2. | Au—Ni | 2% | 2% | 2% | 2% | 3% | 4% |
| 3. | Au—Ni | 2% | 2% | 2% | 2% | 3% | 5% |
| 4. | Ag—Cu | 2% | 2% | 2% | 2% | 2% | 2% |
| *5. | Au—Ni | 2% | 2% | 3% | 5% | 20% | Broken |
| *6. | Au—Ni | 2% | 2% | 3% | 10% | 50% | Broken after 70 cycles |

According to the samples 5 and 6 regarding the conventional electrostatic chuck, even after the heating and cooling operations were repeated 100 times between the room temperature 25° C. and 200° C., their rates of electric resistance change were 2%, which were stably detected. However, after the heating and cooling operations were repeated 100 times between the room temperature 25° C. and 300° C., the rates of electric resistance change were increased to 5% and 10%. Furthermore, after the heating and cooling operations were repeated 10 times between the room temperature 25° C. and 500° C., the rates of electric resistance change of No. 5 and No. 6 were increased to 20% and 50%, respectively. Furtiermore, according to the No. 5, after the heating and cooling operations were repeated 100 times, the sample was broken and according to No. 6, after the heating and cooling operations were repeated 70 times, the sample was broken. Then, the electrostatic chuck was removed from the testing apparatus and confirmed. As a result, it was found that the electrostatic chuck according to the sample No. 5 using the via hole as the feeding structure, a recessed part was generated in the via hole serving as the conductive layer and the sample was partially broken. That is, since the thermal expansion coefficient of filling of the via holes is close to that of metal tungsten, the recessed part or rupture was generated during the thermal cycles because of the thermal expansion difference from the plate-shaped ceramic body mainly formed of aluminum nitride.

In addition, according to the sample No. 6 regarding the electrostatic chuck in which the copper wire was brazed to the connection conductive layer, after the heating and cooling operations were repeated, a crack 641 was generated at a brazed part 640 between the copper wire and the connection conductive layer on the inner surface of the gas supply hole and peeled off as shown in FIG. 10. This is considered that since the brazed part with the copper wire was a partial brazing, the stress due to the thermal expansion difference was not uniform and distortion due to the thermal cycles was concentrated on this brazed part, so that the part was broken.

Meanwhile, according to the sample No. 1 regarding the wafer support member which comprises the plate-shaped ceramic body of the present invention whose one main surface is the mount surface on which the wafer is mounted, the conductive layer formed on the surface of the mount surface, and the connection conductive layer connected to the conductive layer and formed on the surface different from the mount surface, in which the connection conductive layer is connected to the exposed part of the buried conductive layer which is buried in the plate-shaped ceramic body, and the buried conductive layer is connected to the conducting terminal provided on the other main surface of the plate-shaped ceramic body, even after the heating and cooling operations were repeated 100 times between the room temperature 25° C. and 500° C., the rate of electric resistance change was only 5% and the wafer support member showed excelleat characteristics. As a result, it was found that the sample No. 1 could be used as the wafer detecting means.

In addition, according to the sample No. 1, it was found that it was preferably to form the connection conductive layer on the inner surface of the via hole penetrating the plate-shaped ceramic body.

Furthermore, according to the sample No. 2 regarding the wafer support, member in which the conducting terminal was the conductive pipe connected to be communicated with the via hole, even when the heating and cooling operations were repeated 100 times between the room temperature 25° C. and 300° C., the rate of electric resistance change was only 2%, and even after the heating and cooling operations were repeated 100 times between the room temperature 25° C. and 500° C., the rate of electric resistance change was only 4% and the wafer support member showed excellent characteristics. This was considered that the brazing material connecting the conduction member is covered with the flange of the pipe and prevented from being oxidized.

In addition, according to the sample No. 3 regarding the wafer support member which comprises the plate-shaped ceramic body of the present invention whose one main surface is the mount surface on which the wafer is mounted, the via hole penetrating the plate-shaped ceramic body, the conductive layer provided on the surface of the mount surface, the connection conductive layer formed on the inner surface of the via hole, and the conductive pipe provided on the other main surface of the plate-shaped ceramic body and connected to be communicated with the via hole, in which the conductive layer and the connection conductive layer are directly connected and the connection conductive layer and the pipe are directly connected, even after the heating and cooling operations were repeated 100 times between the room temperature 25° C. and 500° C., the rate of electric resistance change was only 5% and it was found that the sample No. 3 could be used as the feeding structure for detecting the wafer.

According to the sample No. 4 in which the connection conductive layer is mainly formed of silver and copper, even after the heating and cooling operations were repeated 100 times between the room temperature 25° C. and 500° C., the rate of electric resistance change was only 5% and the wafer support member showed excellent characteristics.

That is, when the connection conductive layer is formed of the brazing material mainly comprising silver and copper, since the brazing material is soft, it can alleviate the thermal stress even when there is a thermal expansion difference from the plate-shaped ceramic body, so that the connection conductive layer is not likely to peel off. Thus, it showed the excellent characteristics.

What is claimed is:

1. A wafer support member comprising;
   a plate-shaped ceramic body having one main surface of a mount surface on which a wafer is mounted and a penetrating via hole from one main surface to the other main surface,
   a conductive layer provided on the mount surface,
   a connection conductive layer provided on an inner surface of the via hole so as to be connected to the conductive layer,
   a buried conductive layer which is buried in the plate-shaped ceramic body so as to be connected to the connection conductive layer,
   a conducting member having one end and the other end and arranged apart from the via hole of the plate-shaped ceramic body so that it is connected to the buried conductive layer in the vicinity of one end, and
   a conductive pipe connected to the other main surface of the plate-shaped ceramic body and a central axis of the via hole coincides with a central axis of the conductive pipe,
   wherein the conducting member is connected to the pipe.

2. The wafer support member according to claim 1;
   wherein the buried conductive layer is a circular conductive layer,
   wherein the diameter of the buried conductive layer is 5 mm to 100 mm.

3. The wafer support member according to claim 1;
   wherein the connection conductive layer has silver and copper as main component.

4. The wafer support member according to claim 1;
   wherein the conductive layer is provided so as to extend to the inner peripheral surface of the via hole and its extended part is connected to the connection conductive layer.

5. The wafer support member according to claim 1;
   wherein the conductive layer comprise a center conductive layer provided in the center of the mount surface and a periphery conductive layer provided at a periphery of the mount surface so as to be electrically separated from the center conductive layer.

6. The wafer support member according to claim 1;
   wherein the conductive layer is used to detect the wafer.

7. The wafer support member according to claim 1;
   wherein the plate-shaped ceramic body comprise an electrostatic chucking electrode.

8. The wafer support member according to claim 1;
   wherein the plate-shaped ceramic body comprise a heater electrode.

9. The semiconductor equipment comprising a wafer support member according to claim 1.

* * * * *